United States Patent
Kim

(10) Patent No.: US 7,187,164 B2
(45) Date of Patent: Mar. 6, 2007

(54) APPARATUS FOR CALIBRATING A PROBE STATION

(75) Inventor: Jung-nam Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 41 days.

(21) Appl. No.: 10/921,151

(22) Filed: Aug. 19, 2004

(65) Prior Publication Data

US 2005/0046437 A1    Mar. 3, 2005

(30) Foreign Application Priority Data

Aug. 29, 2003 (KR) .................. 10-2003-0060262

(51) Int. Cl.
*G01R 31/02* (2006.01)
(52) U.S. Cl. .................. 324/158.1; 324/754; 324/760
(58) Field of Classification Search .................. None
See application file for complete search history.

(56) References Cited

U.S. PATENT DOCUMENTS

| 3,154,654 | A | * | 10/1964 | Woods et al. .................. 337/80 |
|---|---|---|---|---|
| 3,858,978 | A | * | 1/1975 | Johannsmeier ................ 355/79 |
| 4,471,535 | A | * | 9/1984 | Kufrovich et al. ............. 33/378 |
| 5,237,267 | A | * | 8/1993 | Harwood et al. ........... 324/754 |
| 6,084,215 | A |   | 7/2000 | Furuya et al. |
| 6,583,638 | B2 | * | 6/2003 | Costello et al. ............. 324/760 |
| 2003/0188686 | A1 | * | 10/2003 | Miyagi ....................... 118/715 |

FOREIGN PATENT DOCUMENTS

| DE | 29619981 U1 | * | 3/1998 |
|---|---|---|---|
| KR | 2000-0046806 |  | 7/2000 |
| KR | 2003-0001830 |  | 1/2003 |

\* cited by examiner

*Primary Examiner*—Paresh Patel
(74) *Attorney, Agent, or Firm*—Lee & Morse, P.C.

(57) ABSTRACT

An apparatus for calibrating a probe station includes a disk having a flat bottom surface, a plurality of thermosensors for measuring a temperature of a wafer chuck of the probe station, the plurality of thermosensors being disposed at predetermined positions on a top surface of the disk, and a level disposed at a predetermined position on the top surface of the disk.

20 Claims, 5 Drawing Sheets

APPARATUS FOR CALIBRATING A PROBE STATION

BACKGROUND OF THE INVENTION

1. Field of the Invention

The present invention relates to a calibration apparatus used in the fabrication of semiconductor devices. More particularly, the present invention relates to a calibration apparatus for inspecting and maintaining a probe station.

2. Description of the Related Art

In the manufacture of semiconductor devices, a plurality of chips is regularly arranged on a semiconductor wafer. Each of the chips includes a plurality of electronic devices, such as transistors, capacitors, resistors, and interconnections for connecting therebetween, and a plurality of bonding pads for connecting the electronic devices. The electronic devices are required to have proper physical structure and electrical interconnections so that the electronic devices are able to perform particular functions of the chip.

The electronic devices should be fabricated based on the particular design thereof so that the electronic devices are able to operate normally in various situations. Each step of the semiconductor fabrication process is, however, accompanied with factors inducing poor product quality, e.g., an incorrect process condition, faulty fabrication equipment, operator error, and others. Thus, chips fabricated by a deficient process step may unintentionally be inferior. In an effort to prevent a sale of inferior chips, a test step for testing the chips in a wafer level, which is called a "wafer test," is required before packaging the chips. A subsequent test step of testing a packaged chip is called a "package test." The wafer test is performed in order to analyze reasons of inferiority generated in the fabricating process and provide feedback based on the analysis to the fabricating process of semiconductor product.

A tester and a probe station are used to perform the wafer test. The tester is test equipment for analyzing whether, under an electrical input signal, the chips operate normally, and includes a computer with a built-in test program, electrical signal source units and electrical signal measurement units. The probe station is another test equipment for aligning and contacting a probe card with a plurality of probing needles on a predetermined position of the chip and electrically testing the chips. For performing these functions, the probe station includes the probe card, a wafer chuck for loading the wafer and a wafer chuck movement apparatus for three-dimensionally manipulating the position of the wafer chuck.

The probe station, particularly the wafer chuck, require periodic inspection and/or repair to perform the wafer test quickly and accurately. Inspection items, i.e., aspects that are to be inspected, required in connection with the probe station, and in particular, the wafer chuck, should include a horizontality of the wafer chuck, a temperature of the wafer chuck, a vacuum pressure of the wafer chuck, a tilt angle between the needle cleaning unit and the wafer chuck, a performance of a camera and a horizontality of the probe station. Conventionally, each of the inspection items is measured using a corresponding special tool in a corresponding special step. However, these conventional tools for each inspection item are difficult to prepare and maintain. Further, these conventional inspection tools require unnecessary inspection time.

SUMMARY OF THE INVENTION

The present invention is therefore directed to an apparatus for calibrating a probe station that is individually capable of measuring various inspection items of the probe station, which substantially overcomes one or more of the problems due to the limitations and disadvantages of the related art.

According to a feature of an embodiment of the present invention, there is provided an apparatus for calibrating a probe station including a disk having a flat bottom surface, a plurality of thermosensors for measuring a temperature of a wafer chuck of the probe station, the plurality of thermosensors being disposed at predetermined positions on a top surface of the disk, and a level disposed at a predetermined position on the top surface of the disk.

In the apparatus, the disk may be made of at least one material selected from the group consisting of metallic materials, insulating materials, and compounds including silicon atoms. The disk may have a multi-layered structure. The disk may include a bottom layer and a top layer, wherein the bottom layer is a metallic material having a high thermal conductivity and the top layer is an insulating material having a low thermal conductivity.

In the apparatus, the level may be a spirit level or a digital level. Alternatively, the level is a plurality of levels including a pair of spirit levels and a pair of digital levels.

In the apparatus, each of the plurality of thermosensors may be one selected from the group consisting of a thermocouple, a thermistor, a platinum resistance thermometer, a glass thermometer, an IC temperature sensor, a bimetal, a ferrite, a quartz thermometer, and a nuclear quadrupole resonator (NQR) thermometer. In an embodiment of the present invention, one of the plurality of thermosensors may be each disposed at a top portion, a bottom portion, a center, a left portion and a right portion of a wafer chuck of the probe station.

The apparatus may further include a connector disposed at a predetermined position on the disk, the connector being electrically connecting to each of the plurality of thermosensors.

The apparatus may further include an extended level for measuring a height difference and a tilt angle between a wafer chuck of the probe station and a predetermined external device, the extended level being disposed at a predetermined location of the disk. The extended level may be a spirit level or a digital level.

The apparatus may further include a groove having a predetermined depth formed in the top surface of the disk to receive the extended level to facilitate a downward movement of the extended level. A bottom surface of the groove may be inclined.

The apparatus may further include a camera calibration tool for examining a condition of a camera of the probe station, the camera calibration tool being disposed at a predetermined position on the disk. The camera calibration tool may include a glass panel having a specific optical pattern.

The apparatus may further include a handle for removing the apparatus for calibrating a probe station from a wafer chuck of the probe station, the handle being disposed at a predetermined position on the top surface of the disk, wherein the handle is made of a material having a low thermal conductivity.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
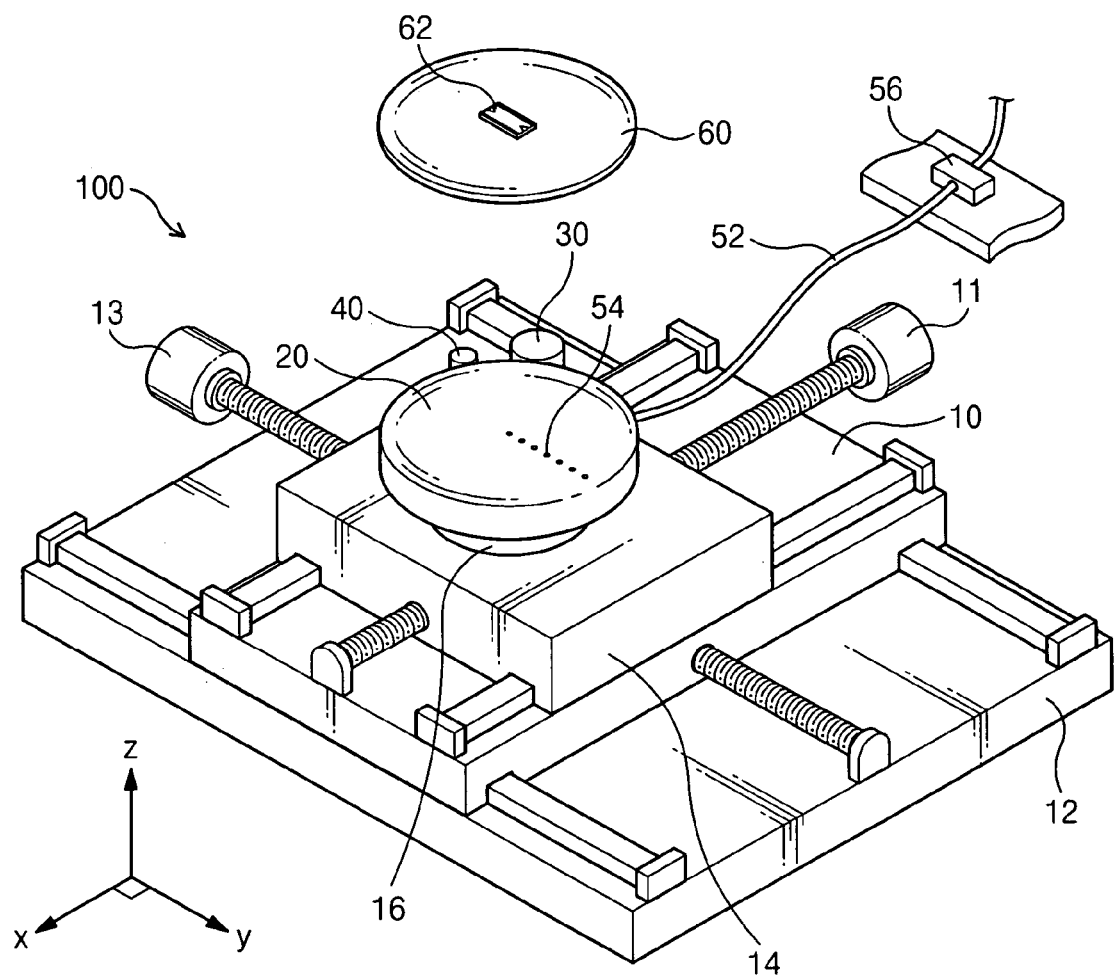
FIG. 1 illustrates an elevated, perspective view of a conventional probe station having a wafer chuck.

Korean Patent Application No. 2003-60262, filed Aug. 29, 2003, in the Korean Intellectual Property Office, and entitled: "Apparatus for Calibrating Probe Station," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

Figure 2:
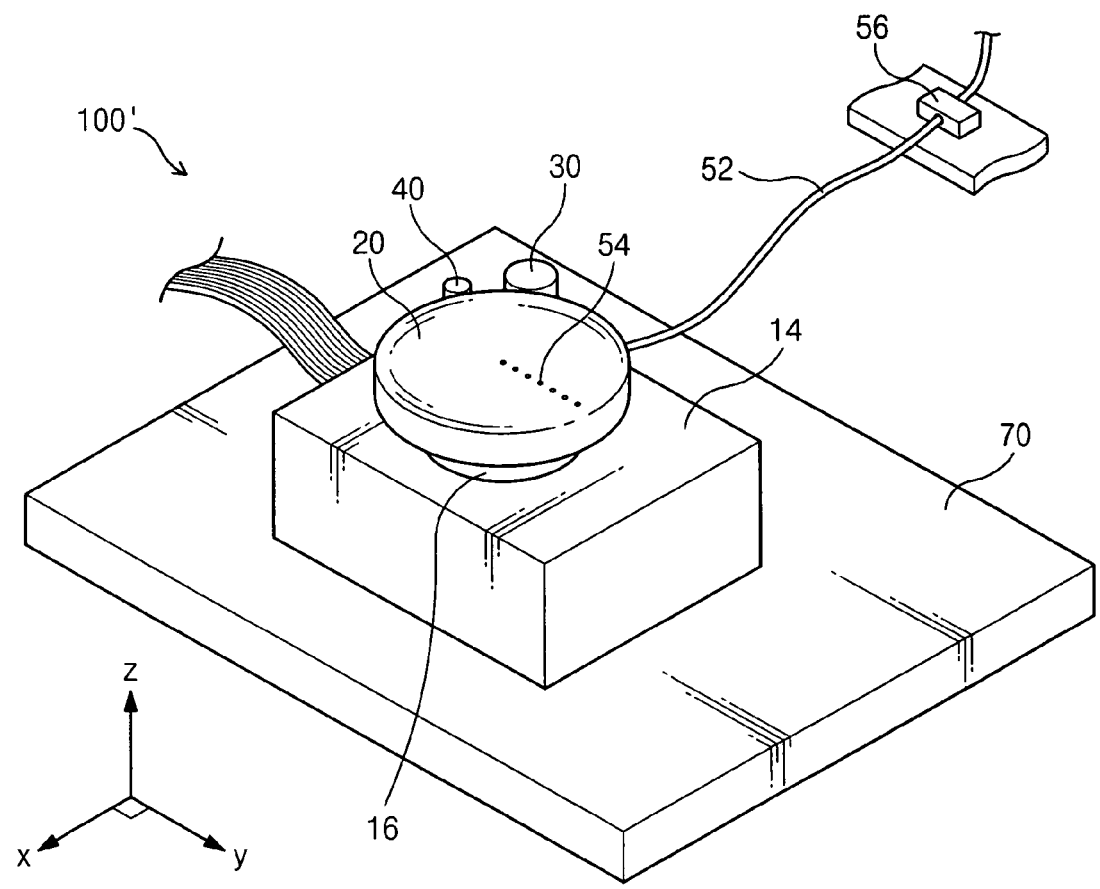
FIG. 2 illustrates an elevated, perspective view of another conventional probe station having a wafer chuck.

To provide a context for the present invention, FIGS. 1 and 2 illustrate conventional probe stations, which may be calibrated using the calibration apparatus according to an embodiment of the present invention. In particular, FIG. 1 illustrates an elevated, perspective view of a conventional probe station having a wafer chuck and FIG. 2 illustrates an elevated, perspective view of another conventional probe station having a wafer chuck.

Referring to FIG. 1, the probe station 100 includes an x-axis micro-scale movement mechanism 10, a y-axis micro-scale movement mechanism 12, an ascending/descending mechanism 14, a rotation mechanism 16, and a wafer chuck 20.

Both the x-axis micro-scale movement mechanism 10 and the y-axis micro-scale movement mechanism 12 include predetermined guides and predetermined driving gears 11 and 13, respectively. A plurality of vacuum holes 54 is formed through the wafer chuck 20 and is connected to a vacuum pump (not shown) by a pipe 52. A vacuum gauge 56 is attached to the pipe 52 between the vacuum pump and the wafer chuck 20. In addition, a needle cleaning unit 40 and a camera 30 are disposed around the wafer chuck 20.

As previously described in connection with the related art, a horizontality of the wafer chuck, a temperature of the wafer chuck, a vacuum pressure of the wafer chuck, a tilt angle between the needle cleaning unit and the wafer chuck, a performance of the camera and a horizontality of the probe station should be included as required inspection items in connection with the wafer chuck 20.

A horizontality of a wafer should be additionally inspected so that needles 62 of a probe card 60 uniformly contact a top surface of the wafer over the entire wafer. That is, if the horizontality of the wafer chuck is incorrectly adjusted, the needles 62 may be adequately, excessively or insufficiently contacted with the wafer, depending on a position of the probe card 60.

In operation, the wafer chuck 20 is able to move along the x-axis micro-scale movement mechanism 10 and the y-axis micro-scale movement mechanism 12. Thus, a top surface of the wafer chuck 20 should be parallel with both movement directions of the x-axis and y-axis micro-scale movement mechanisms 10 and 12 so that the horizontality of the wafer chuck is adjusted correctly. Generally, the x-axis and y-axis micro-scale movement mechanisms 10 and 12 are adjusted so that movement directions thereof are parallel with a top surface of water, i.e., a plane perpendicular to a moving direction of a free falling object. Thus, for adjusting the horizontality of the wafer chuck, the top surface of the wafer chuck 20 should be also regulated to be parallel with the top surface of water. Accordingly, a level is used to adjust the horizontality of the wafer chuck 20.

As previously discussed, the x-axis and y-axis micro-scale movement mechanisms 10 and 12 should also be installed so that moving directions thereof run parallel to the top surface of water. The above-mentioned horizontality of the probe station is an inspection item that satisfies this requirement. Thus, for correctly regulating the horizontality of the probe station, both the x-axis and y-axis micro-scale movement mechanisms 10 and 12 should move parallel to the top surface of the water. A level may be similarly used for calibrating the x-axis and y-axis micro-scale movement mechanisms 10 and 12 in connection with the horizontality of the probe station.

Contrary to the mechanical movement shown in FIG. 1, planar movement of the wafer chuck 20 may be accomplished by electronic movement, as may be seen in another conventional probe station having a wafer chuck as shown in FIG. 2. Referring to FIG. 2, the wafer chuck 20 is disposed over a predetermined supporting plate 70. A predetermined electronic movement mechanism is disposed under the supporting plate 70 to move the wafer chuck 20 electronically. A series of electromechanical devices, including the wafer chuck 20, is able to float above the supporting plate 70 at a predetermined distance due to an electromagnetic force induced from the electronic movement mechanism. In this probe station 100', which utilizes electronic movement, the above-mentioned horizontality of the probe station means the horizontality of a top surface of supporting plate 70. As with the previous conventional probe station, a level may be used for measuring the horizontality of the top surface of supporting plate 70, i.e., the horizontality of the probe station.

The wafer test may be performed at room temperature as well as a high temperature, e.g., about 85° C. For performing the wafer test at a specific temperature, it is necessary to check the temperature of the wafer chuck. Thus, an item for examining a temperature of a heated wafer chuck 20 is required. Preferably, a temperature of the wafer chuck 20 is measured at various points, because it may vary according to position. In particular, the temperature of the wafer chuck 20 is preferably measured at five points, e.g., center, top, bottom, left, and right.

As stated above, the wafer chuck 20 is electromechanical equipment for moving the wafer, and the wafer is attached to the wafer chuck 20. The vacuum holes 54, the vacuum pump, the pipe 52, and the vacuum gauge 56 are used to attach the wafer to the wafer chuck 20. If the vacuum pressure is insufficient, i.e., too low, the wafer can slip during a movement of the wafer chuck 20. Accordingly, the vacuum pressure of the wafer chuck should be checked to prevent the wafer from slipping.

The needles 62 are mechanically contacted with bonding pads formed on the wafer. Since the needles 62 generally have a greater hardness than the bonding pads, if the mechanical contact of the needles 62 happens frequently, the endpoints of the needles 62 may become contaminated. The needle cleaning unit 40 is a cleaning tool for cleaning the contaminated needles 62. A cleaning process of the needles 62 includes contacting the needles 62 of the probe card 60 with the top surface of the needle cleaning unit 40, before or after performing the wafer test. It is desired that the needle cleaning unit 40 is parallel to the wafer chuck 20 in order to clean the needles 62 sufficiently. In addition, the needle cleaning unit 40 preferably has a height similar to the top surface of the wafer chuck 20. Thus, the tilt angle between the needle cleaning unit 40 and the wafer chuck 20 is an item for examining differences in horizontality and height between top surfaces of the needle cleaning unit 40 and the wafer chuck 20.

The camera 30 is disposed beside the wafer chuck 20 to provide an image of the needles 62. Thus, the contamination and arrangement of the needles 62 can be monitored by the camera 30. Assurance of a high quality performance of the camera 30 is needed to obtain the best image of the needles 62. High quality may be assured by inspecting various aspects, such as focus length, brightness, contrast and others. A calibration tool having a predetermined optical indicator may be used for verifying and, if necessary, adjusting the performance of the camera.

Figure 3:
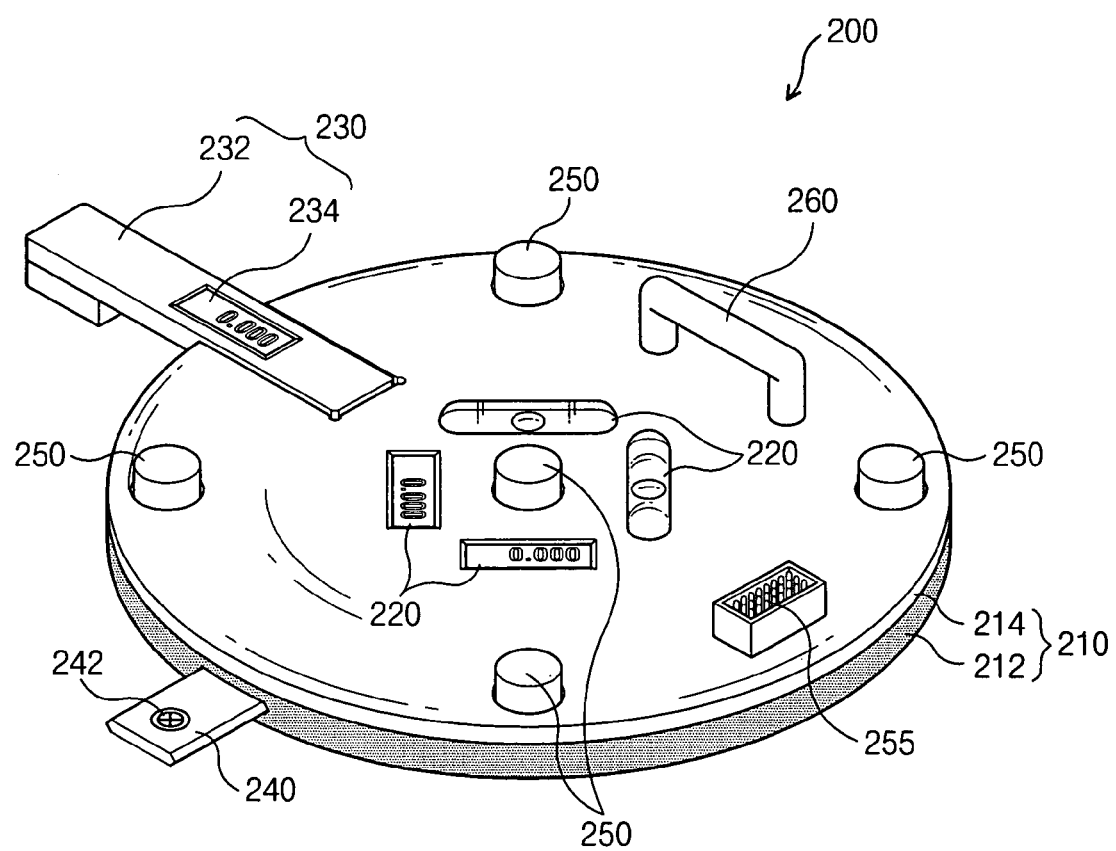
FIG. 3 illustrates an elevated, perspective view of a calibrating apparatus of a probe station according to an embodiment of the present invention.

FIG. 3 illustrates an elevated, perspective view of an apparatus for calibrating a probe station according to an embodiment of the present invention.

Referring to FIG. 3, according to an embodiment of the present invention, a calibrating apparatus 200 of a probe station includes a disk 210 having a flat bottom surface. The disk 210 may have a variety of diameters, e.g., 200 mm or 300 mm. Because the disk 210 is provided with a flat bottom surface, the calibrating apparatus 200 can be used in a step for measuring the vacuum pressure of the wafer chuck. More specifically, the calibrating apparatus 200 may be closely disposed on the wafer chuck 20 instead of a wafer. After the calibrating apparatus 200 has been positioned on the wafer chuck 20 of a probe station, vacuum pressure can be easily checked by reading a degree of the vacuum gauge 56.

The disk 210 is made of at least one material selected from the group consisting of metallic materials, insulating materials, and compounds including silicon atoms. In addition, the disk 210 may be a multi-layered structure. For example, the disk 210 may have a bi-layered structure having a bottom layer 212 and a top layer 214. The bottom layer 212 may be a metallic material-having a high thermal conductivity, e.g., aluminum. The top layer 214 may be an insulating material having a low thermal conductivity.

At least one level 220, and preferably two or more levels 220, is provided on a top surface of the disk 210. The levels 220 are preferably disposed at right angles to each other to measure tilt angles of the disk 210 in different directions. A spirit level or a digital level may be used for the level 220. According to an embodiment of the present invention, as shown in FIG. 3, the calibration apparatus 200 includes a pair of spirit levels and a pair of digital levels.

An extended level 230 is disposed at one side of the disk 210. The extended level 230 is used to measure a height difference and a tilt angle between the wafer chuck 20 and an arbitrary external device. The external device may be a component disposed beyond the wafer chuck 20, e.g., the needle cleaning unit 40. In order to quantitatively measure a height and a slope, the, extended level 230 has a bar 232 that can be rotated on a spindle 235 connected to the disk 210 (see FIG. 5). The bar 232 includes a level 234 disposed on a top surface thereof to indicate a tilt angle of the bar 232. Here, the level 234 may be a digital level to facilitate reading of the tilt angle.

Figure 5:
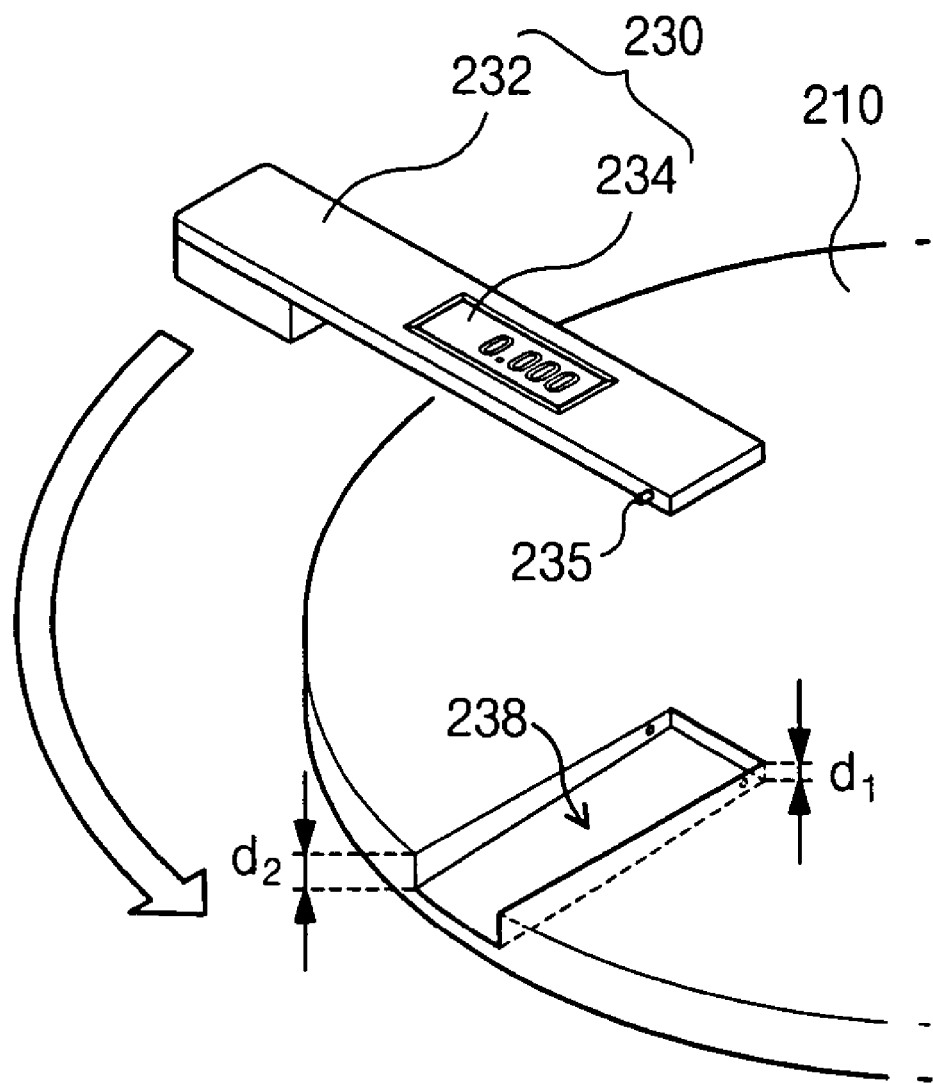
FIG. 5 illustrates an elevated, perspective view of a coupling structure between an extended level and a disk equipped in the calibrating apparatus of the probe station according to the embodiment of the present invention.

Referring to FIG. 5, a groove 238 having a predetermined depth is formed in the top surface of the disk 210 to receive the bar 232 so that the bar 232 is able to tilt in a downward direction on the spindle 235. A scale may be graduated in the bar 232 to indicate a distance from the disk 210 to the external device. A height difference between the top surface of the wafer chuck 20 and the external device can be calculated using the distance and the tilt angle measured by the bar 232 and a trigonometric function. A bottom surface of the groove 238 may be inclined. Thus, although a top surface of the external device is lower than the disk 210, a height and a tilt angle of the external device can be measured by the bar 232. More specifically, a first depth $d_1$ of the groove 238, where the bar 232 connects with the spindle 235, is smaller than a second depth $d_2$ of the groove 238, which is at the edge of the disk 210.

Referring back to FIG. 3, a camera calibration tool 240 is positioned beside the disk 210 to examine a condition of the camera 30. The camera calibration tool 240 may be inserted into the disk 210, as shown in FIG. 3, and includes a glass panel 242 having a specific optical pattern. The optical pattern of the glass panel 242 is used to examine a performance of the camera 30 instead of the needles 62.

Additionally, a plurality of thermosensors 250 is disposed on the top surface of the disk 210 to measure a temperature of the wafer chuck 20. The thermosensors 250 may be composed of at least one of various thermometers, e.g., a thermocouple, a thermistor, a platinum resistance thermometer, a glass thermometer, an IC temperature sensor, a bimetal, a ferrite, a quartz thermometer, a nuclear quadrupole resonator (NQR) thermometer, among others. According to an embodiment of the present invention, the thermosensors 250 are disposed at five places on the wafer chuck 20, i.e., center, top, bottom, left, and right.

Figure 4:
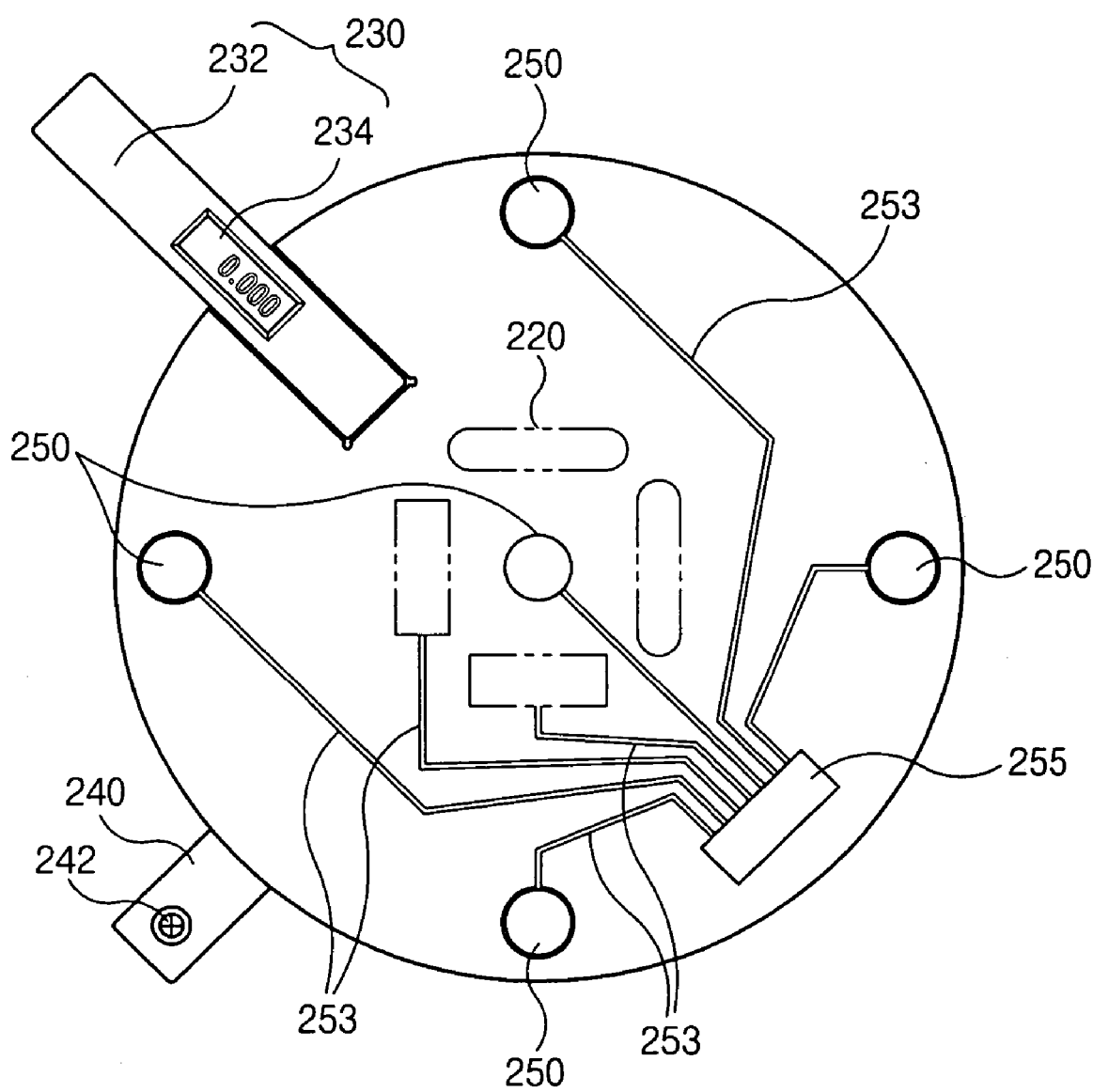
FIG. 4 illustrates a plan view of a connection structure between a plurality of thermosensors and a connector in the calibrating apparatus of the probe station according to the embodiment of the present invention.

The thermosensors 250 may additionally include an electronic device that can display a measured result. To provide this feature, the thermosensors 250 are electrically connected to a connector 255 disposed at a predetermined position on the disk 210 by interconnecting lines 253, as shown in FIG. 4. By using this connector 255, the temperature of the disk 210 can be easily measured without connecting an electric wire to each one of the thermosensors 250 individually. Moreover, according to another embodiment of the present invention, a remote controller (not shown), such as a computer, may be used for adjusting a slope of wafer chuck 20. In this case, the connector 255 may be electrically connected to the levels 220 to transmit information on the slope of the wafer chuck 20 to the remote controller.

A handle 260 may be disposed at a predetermined position on the disk 210 and is made of a material having a low thermal conductivity. The handle 260 is used to facilitate the removal of the calibrating apparatus 200 of a probe station from the top surface of the wafer chuck 20. As described above, the bottom layer 212 is made of a material having a high thermal conductivity for quickly and accurately measuring a temperature of the wafer chuck 20. Prior to removing a heated calibration apparatus 200, however, the calibration apparatus 200 must be cooled, which requires a particular amount of time after a temperature of the wafer chuck 20 has been measured. When the handle 260 is provided on the disk 210, however, this cooling time is unnecessary.

As stated above, the calibration apparatus 200 of a probe station according to an embodiment of the present invention is alone able to measure various inspection items, such as a horizontality of the wafer chuck, a temperature of the wafer chuck, a vacuum pressure of the wafer chuck, a tilt angle between the needle cleaning unit and the wafer chuck, and a performance of the camera. In addition, this calibration apparatus 200 may be used to check and maintain the horizontality of a probe station that affects the horizontality of a wafer chuck. Thus, steps for checking and maintaining a probe station can be effectively performed, thereby increasing productivity in a fabrication of semiconductor products.

Moreover, an operator may conveniently use a calibration apparatus according to an embodiment of the present invention due to simplicity with respect to equipment, recovery, storage and transportation.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An apparatus for calibrating a probe station, comprising:
    a disk having a flat bottom surface, the disk including at least one metallic material such that the flat bottom surface of the disk is thermally conductive;
    a plurality of thermosensors for measuring a temperature of a wafer chuck of the probe station, the plurality of thermosensors being disposed at predetermined positions on a top surface of the disk; and
    a level disposed at a predetermined position on the top surface of the disk.

2. The apparatus as claimed in claim 1, wherein the disk further includes at least one material selected from the group consisting of insulating materials, and compounds including silicon atoms.

3. The apparatus as claimed in claim 1, wherein the disk has a multi-layered structure.

4. The apparatus as claimed in claim 1, wherein the level is a spirit level or a digital level.

5. The apparatus as claimed in claim 1, wherein the level is a plurality of levels including a pair of spirit levels and a pair of digital levels.

6. The apparatus as claimed in claim 5, further comprising a connector disposed at a predetermined position on the disk, the connector being electrically connected to each of the plurality of levels.

7. The apparatus as claimed in claim 1, wherein each of the plurality of thermosensors is one selected from the group consisting of a thermocouple, a thermistor, a platinum resistance thermometer, a glass thermometer, an IC temperature sensor, a bimetal, a ferrite, a quartz thermometer, and a nuclear quadrupole resonator (NQR) thermometer.

8. The apparatus as claimed in claim 1, wherein one of the plurality of thermosensors is each disposed at a top portion, a bottom portion, a center, a left portion and a right portion of a wafer chuck of the probe station.

9. The apparatus as claimed in claim 1, further comprising a connector disposed at a predetermined position on the disk, the connector being electrically connected to each of the plurality of thermosensors.

10. The apparatus as claimed in claim 1, further comprising an extended level for measuring a height difference and a tilt angle between a wafer chuck of the probe station and a predetermined external device, the extended level being disposed at a predetermined location of the disk.

11. The apparatus as claimed in claim 10, wherein the extended level is a spirit level or a digital level.

12. The apparatus as claimed in claim 10, further comprising a groove having a predetermined depth formed in the top surface of the disk to receive the extended level to facilitate a downward movement of the extended level.

13. The apparatus as claimed in claim 12, wherein a bottom surface of the groove is inclined.

14. The apparatus as claimed in claim 1, further comprising a camera calibration tool for examining a condition of a camera of the probe station, the camera calibration tool being disposed at a predetermined position on the disk.

15. The apparatus as claimed in claim 14, wherein the camera calibration tool comprises a glass panel having a specific optical pattern.

16. The apparatus as claimed in claim 1, further comprising a handle for removing the apparatus for calibrating a probe station from a wafer chuck of the probe station, the handle being disposed at a predetermined position on the top surface of the disk, wherein the handle is made of a material having a low thermal conductivity.

17. The apparatus as claimed in claim 1, further comprising a connector disposed at a predetermined position on the disk, the connector being electrically connected to the level.

18. The apparatus as claimed in claim 1, wherein the at least a portion of one of the plurality of thermosensors protrudes upward beyond the top surface of the disk.

19. The apparatus as claimed in claim 1, wherein the disk may be detachably attached to the probe station and when the disk is detachably attached to the probe station, the disk is detachably attached to the wafer chuck of the probe station.

20. An apparatus for calibrating a probe station, comprising:
    a disk having a flat bottom surface;
    a plurality of thermosensors for measuring a temperature of a wafer chuck of the probe station, the plurality of thermosensors being disposed at predetermined positions on a top surface of the disk; and
    a level disposed at a predetermined position on the top surface of the disk,
    wherein the disk includes a bottom layer and a top layer, wherein the bottom layer, including the flat bottom surface, is a metallic material having a high thermal conductivity and the top layer is an insulating material having a low thermal conductivity.

* * * * *